(12) United States Patent
Lee et al.

(10) Patent No.: US 7,463,461 B2
(45) Date of Patent: Dec. 9, 2008

(54) RESISTIVE SUPERCONDUCTING FAULT CURRENT LIMITER

(75) Inventors: Chan-Joo Lee, Suwon-si (KR); Bok-Yeol Seok, Suwon-si (KR)

(73) Assignee: Hyundai Heavy Industries Co., Ltd. (KR)

( * ) Notice: Subject to any disclaimer, the term of this patent is extended or adjusted under 35 U.S.C. 154(b) by 118 days.

(21) Appl. No.: 11/393,569

(22) Filed: Mar. 30, 2006

(65) Prior Publication Data

US 2006/0268471 A1 Nov. 30, 2006

(30) Foreign Application Priority Data

May 25, 2005 (KR) ...................... 10-2005-0044247

(51) Int. Cl.
*H02H 7/00* (2006.01)
(52) U.S. Cl. ........................................ 361/19
(58) Field of Classification Search ............... 361/19
See application file for complete search history.

(56) References Cited

U.S. PATENT DOCUMENTS

| | | | |
|---|---|---|---|
| 4,638,282 A * | 1/1987 | Ellison | 336/185 |
| 5,021,914 A | 6/1991 | Tsurunaga et al. | 361/19 |
| 5,225,957 A * | 7/1993 | Tsurunaga | 361/19 |
| 6,081,987 A * | 7/2000 | Kalsi et al. | 29/599 |
| 6,137,388 A | 10/2000 | Saravolac | 335/216 |
| 6,275,365 B1 | 8/2001 | Kalsi et al. | 361/19 |
| 6,337,785 B1 * | 1/2002 | Okazaki | 361/19 |
| 6,958,893 B2 * | 10/2005 | Yuan | 361/19 |
| 7,301,425 B2 * | 11/2007 | Ko et al. | 335/216 |

* cited by examiner

*Primary Examiner*—Stephen W Jackson
(74) *Attorney, Agent, or Firm*—Cantor & Colburn LLP

(57) ABSTRACT

A superconducting fault current limiter includes a first superconducting module connected to an input terminal of a power system, a second superconducting module connected to an output terminal of the power system, and a connecting member interposed between the first and second superconducting modules. The first superconducting module and the second superconducting module each include two superconducting coils. The input terminal is connected to an end of the first superconducting module, and the output terminal is connected to an end of the second superconducting module. The end of the second superconducting module is disposed geometrically opposite the end of the first superconducting module.

15 Claims, 15 Drawing Sheets

RESISTIVE SUPERCONDUCTING FAULT CURRENT LIMITER

CROSS-REFERENCE TO RELATED APPLICATION

This application claims the benefit of Korean Patent Application No. 10-2005-0044247, filed May 25, 2006, the disclosure of which is hereby incorporated herein by reference in its entirety.

BACKGROUND OF THE INVENTION

1. Field of the Invention

The present invention relates to a superconducting fault current limiter capable of reducing a fault current in a power application field, such as a lossless power transmission line, a superconductive magnet for generating a strong or very stable magnetic field, an energy storage, a motor, a generator etc., of generating or transporting a large amount of current, and a traffic application field such as a superconducting magnetic levitation train, a superconducting propulsion ship, and so on.

2. Description of the Related Art

A superconducting fault current limiter, which is classified into an inductive type or a resistive type, is an electric power device for instantly generating impedance and sharply lowering fault current when the fault current is generated, while it is operated with a little impedance in a normal state.

The inductive superconducting fault current limiter limits current by mainly using an inductance component as impedance, and the resistive superconducting fault current limiter limits current by mainly using a resistance component as impedance.

In addition, the resistive superconducting fault current limiter generates resistance through rapid phase transition of a superconductor when a fault current is larger than a critical current of the superconducting fault current limiter, and uses the resistance as impedance to limit the fault current.

In particular, the resistive superconducting fault current limiter is a current limiter using a superconducting wire, which is disclosed in U.S. Pat. No. 6,275,365, entitled "Resistive Fault Current Limiter," and U.S. Pat. No. 6,137,388, entitled "Resistive Superconducting Fault Current Limiter," '365 and '388 patents employ a method of almost removing an inductance component by offsetting a magnetic flux component generated from one coil by one generated from the other coil.

In this manner, since the superconducting wire allows a large current to flow without loss due to zero resistance characteristics under a critical temperature, it is possible to put to practical use various types of superconducting power equipment, such as a transformer, a motor, a generator, a current limiter etc., using the superconducting wire as a superconducting coil conductor. In addition, the superconducting wire is widely used in various energy, traffic, and environmental industries applying an electric field, for example, a superconducting power storage, a superconducting power transmission cable, a superconducting magnetic levitation train, a superconducting magnetic isolation apparatus, and so on.

However, as shown in FIG. 1, the conventional resistive superconducting fault current limiters disclosed in '365 and '388 patents include a power input terminal IN and a power output terminal OUT, which are located at the same level, and a dielectric distance between ends of the power input and output terminals IN and OUT is very short, thereby generating disadvantages in electrical insulation.

That is, since most of the conventional resistive superconducting fault current limiters have a very short distance between first and final turns to which operational voltage is applied, they are inevitably vulnerable to the insulation.

In addition, since the conventional superconducting fault current limiters have a structure that a superconducting wire or coil 2 wound around a bobbin 1 is stacked as shown in FIG. 2, a temperature may be excessively increased during the phase transition, and a recovering speed of the fault current limiter may be considerably delayed until the next fault current is limited.

Meanwhile, U.S. Pat. No. 5,021,914, entitled "Superconducting Switch and Current Limiter Using such a Switch," discloses another conventional resistive superconducting fault current limiter using a former made of a glass tube as well as an iron core made of cast iron.

However, in the case of '914 patent, since a low temperature superconducting wire of stabilizer is made of a copper alloy as a main component, the stabilizer has a disadvantage of generating a very low resistance in a quench state of escaping from the superconducting state.

Therefore, the stabilizer of '914 patent requires a very long wire. In addition, the lower temperature superconducting wire has a circular cross-section difficult to be wound around the same frame, and though the wire is wound, a somewhat magnetic leakage flux is generated to make it difficult to expect a perfect non-induction characteristic.

In addition, since '914 patent includes the low temperature superconducting wire, liquid helium should be used as a coolant. However, when the superconducting wire is out of the superconducting state (quench), the liquid helium may be sublimated to remarkably lower insulation resistance. Further, the superconducting wire should be connected in parallel in order to increase a critical current. Nevertheless, '914 patent has no structure capable of connecting the superconducting wire in parallel.

SUMMARY OF THE INVENTION

In order to solve the foregoing and/or other problems, it is an object of the present invention to provide a resistive superconducting fault current limiter capable of obtaining a higher insulation resistance, reducing a temperature increasing width, and rapidly recovering a re-cooling speed of the current limiter, by locating an input terminal and an output terminal of the current limiter opposite to each other to stabilize insulation characteristics, though using the same length as a conventional superconducting wire.

According to an aspect of the present invention, a resistive superconducting fault current limiter includes: a first superconducting module connected to an input terminal side of a power system to stabilize insulation characteristics; a second superconducting module connected to an output terminal to stabilize insulation characteristics; and a connecting member interposed between the first and second superconducting modules to dispose the input and output terminals connected to the first and second superconducting modules opposite to each other.

In one embodiment, the first superconducting module may further include a first outer bobbin having a predetermined diameter, a first wire wound on a peripheral surface of the first outer bobbin in one direction with a predetermined inclination angle, a first inner bobbin having a diameter smaller than that of the first outer bobbin and disposed in the first outer bobbin, a second wire wound on a peripheral surface of the first inner bobbin in the other direction with a predetermined inclination angle so that the second wire has a magnetic field opposite to the first wire, and a current introduction terminal for connecting the first and second wires in parallel.

In another embodiment, the second superconducting module may further include a second outer bobbin having a predetermined diameter, a third wire wound on a peripheral surface of the second outer bobbin in one direction with a predetermined inclination angle, a second inner bobbin having a diameter smaller than that of the second outer bobbin and disposed in the second outer bobbin, a fourth wire wound on a peripheral surface of the second inner bobbin in the other direction with a predetermined inclination angle so that the fourth wire has a magnetic field opposite to the third wire, and a current output terminal for connecting the third and fourth wires in parallel.

In still another embodiment, the connecting member may include a first connecting body coupled to the first outer bobbin for electrical connection of the first and fourth wires, a second connecting body coupled to the second outer bobbin for electrical connection of the second and third wires, a third connecting body disposed in the second connecting body for electrical connection of the first and fourth wires and coupled to the first connecting body and the second inner bobbin, and a fourth connecting body disposed in the first connecting body for electrical connection of the second and third wires and coupled to the second connecting body and the first inner bobbin.

In yet another embodiment, the first connecting body may further include a first circular ring fitted to the first outer bobbin, and a first connecting part extending from the first circular ring to guide the first wire.

In yet another embodiment, the second connecting body may further include a second circular ring fitted to the second outer bobbin, and a second connecting part extending from the second circular ring to guide the third wire.

In yet another embodiment, the third connecting body may further include a third circular ring fitted to the second inner bobbin, and a third connecting part extending from the third circular ring to guide the fourth wire and coupled to the first connecting part.

In yet another embodiment, the fourth connecting body may further include a fourth circular ring fitted to the first inner bobbin, and a fourth connecting part extending from the fourth circular ring to guide the second wire and coupled to the second connecting part.

According to another aspect of the present invention, a resistive superconducting fault current limiter includes: a bobbin having a small diameter; a first wire winding groove formed at a peripheral surface of the bobbin in one direction with a predetermined inclination angle; a second wire winding groove formed, to have a depth different from the first wire winding groove through a stepped surface in the other direction with a predetermined inclination angle; an inner wire wound in the first wire winding groove; an outer wire wound in the second wire winding groove; an insulating material formed between the inner wire and the outer wire; a current introduction terminal connecting the inner and outer wires in parallel; and a current output terminal connecting the inner and outer wires in parallel.

BRIEF DESCRIPTION OF THE DRAWINGS

These and/or other aspects and advantages of the present invention will become apparent and more readily appreciated from the following description of the embodiments, taken in conjunction with the accompanying drawings of which.

DETAILED DESCRIPTION OF THE INVENTION

Figure 1:
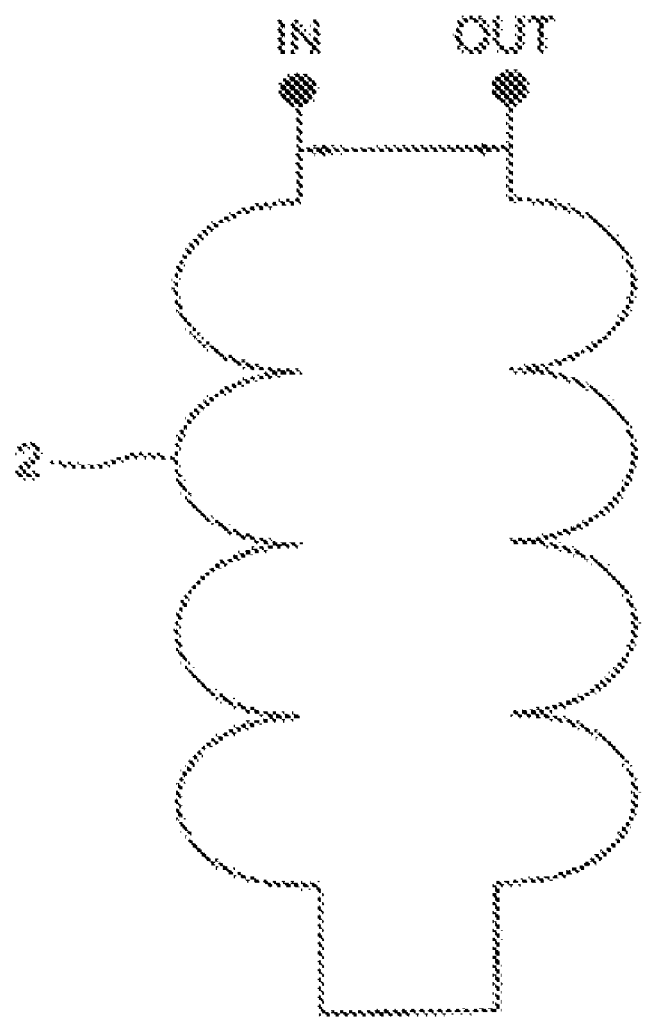
FIG. 1 is a circuit diagram of a conventional resistive superconducting fault current limiter.
Figure 2:
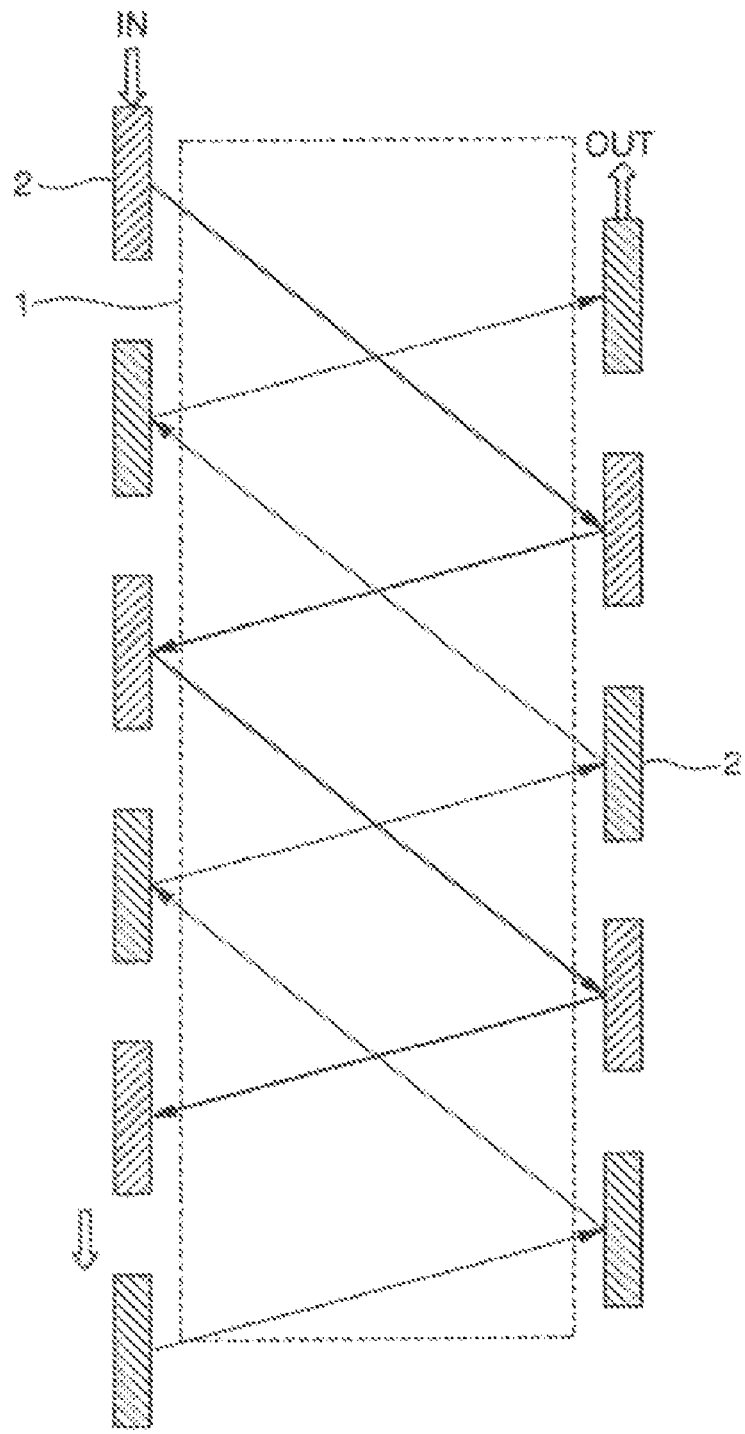
FIG. 2 is a view illustrating a schematic connection of a conventional wire.

Reference will now be made in detail to the embodiments of the present invention, examples of which are illustrated in the accompanying drawings, wherein like reference numerals refer to the like elements throughout. The embodiments are described below in order to explain the present invention by referring to the figures.

Figure 3:
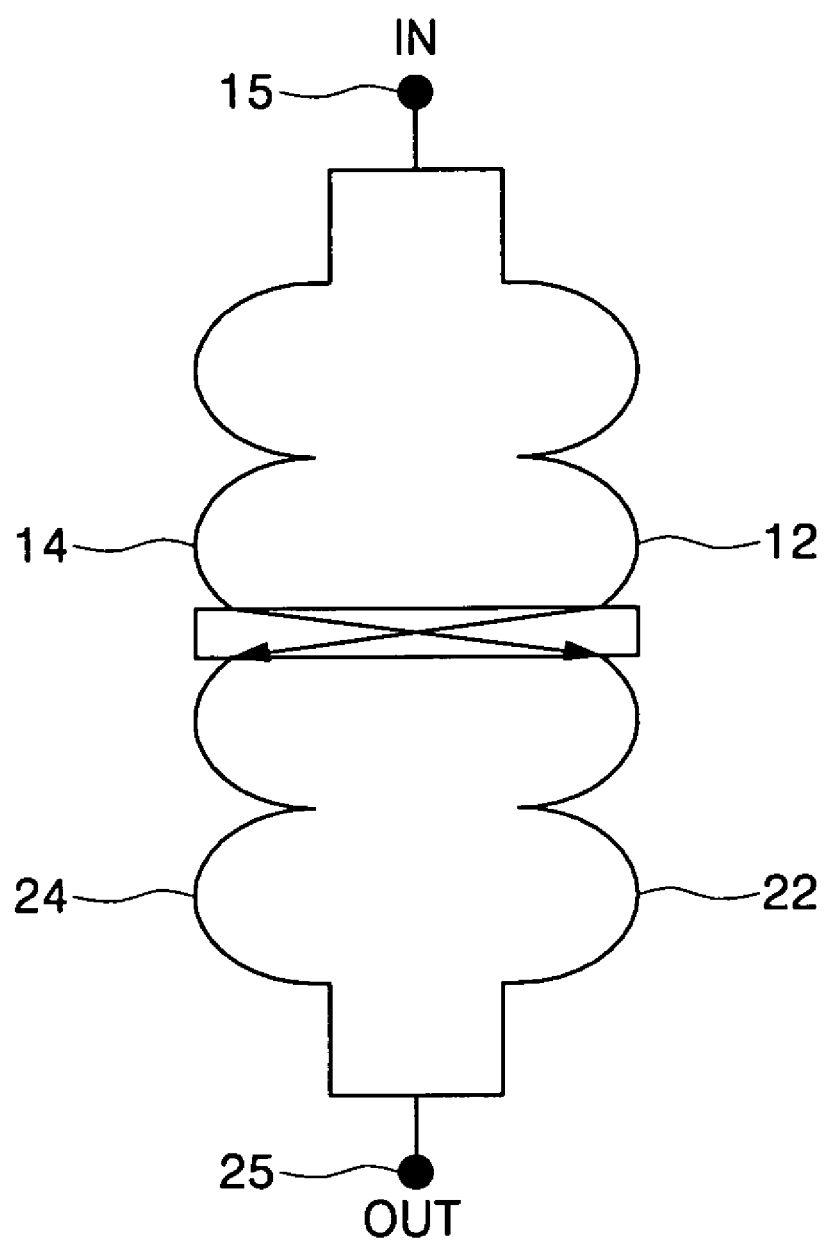
FIG. 3 is a circuit diagram of a resistive superconducting fault current limiter in accordance with a first embodiment of the present invention.
Figure 4:
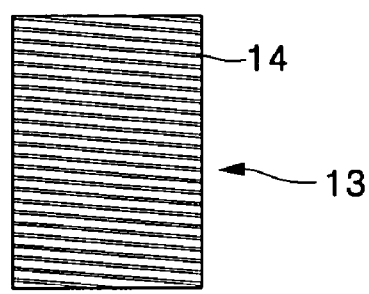
FIG. 4 is an exploded perspective view of a resistive superconducting fault current limiter in accordance with a first embodiment of the present invention.
Figure 4:
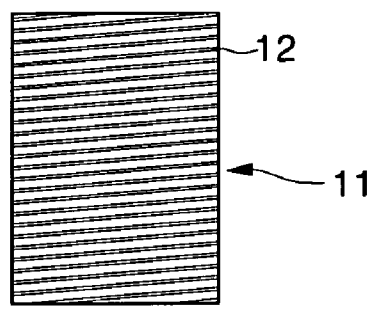
Figure 4:
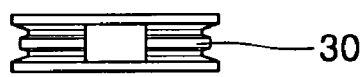
Figure 4:
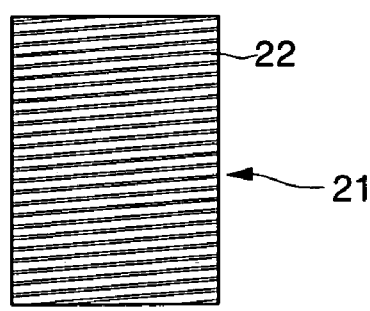
Figure 4:
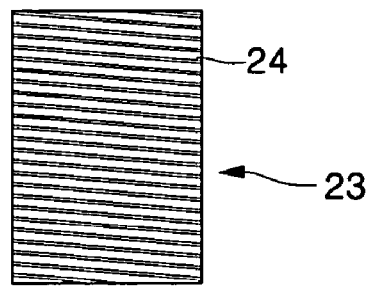
Figure 5:
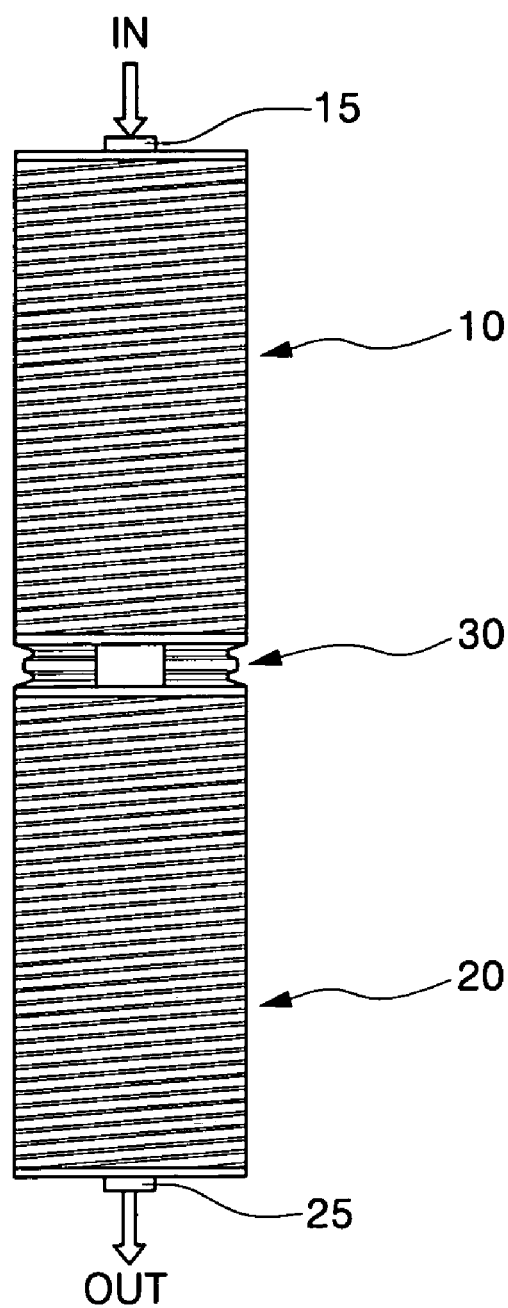
FIG. 5 is an assembled perspective view of a resistive superconducting fault current limiter in accordance with a first embodiment of the present invention.

FIG. 3 is a circuit diagram of a resistive superconducting fault current limiter in accordance with a first embodiment of the present invention, FIG. 4 is an exploded perspective view of a resistive superconducting fault current limiter in accordance with a first embodiment of the present invention, and FIG. 5 is an assembled perspective view of a resistive superconducting fault current limiter in accordance with a first embodiment of the present invention.

Figure 6:
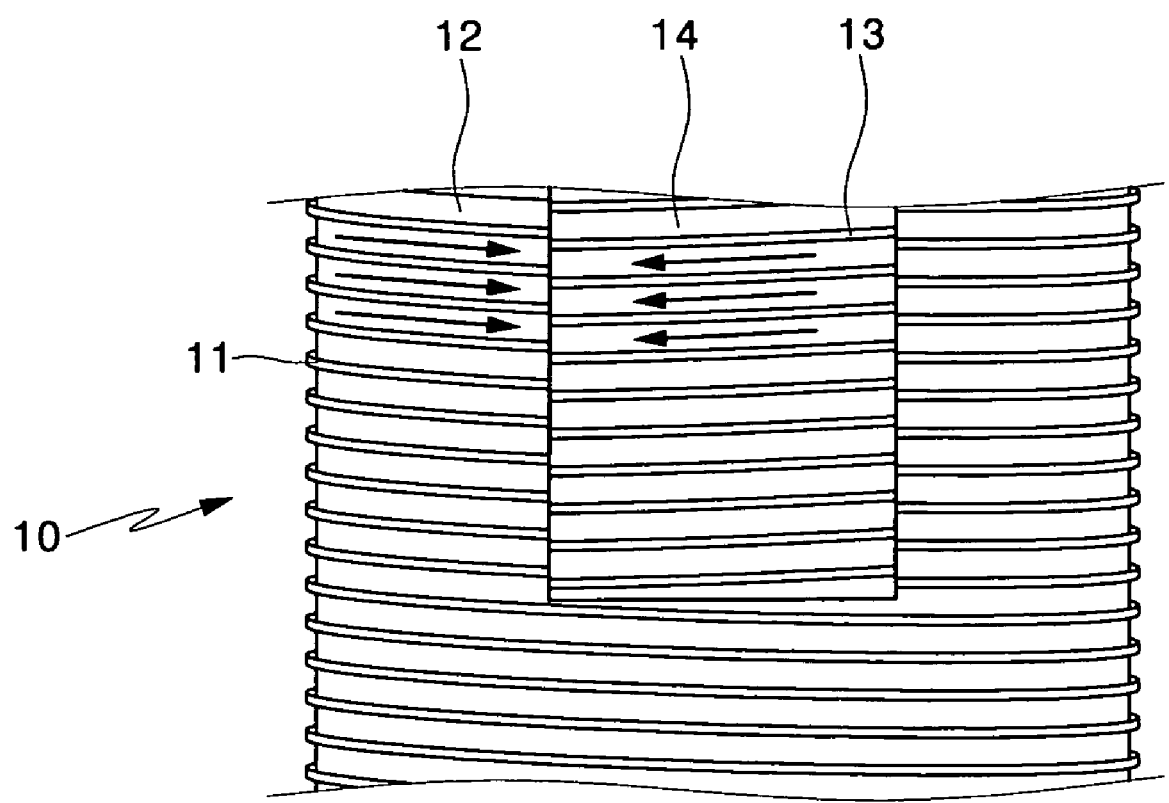
FIG. 6 is a partial cross-sectional view of a first superconducting module in accordance with a first embodiment of the present invention.
Figure 7:
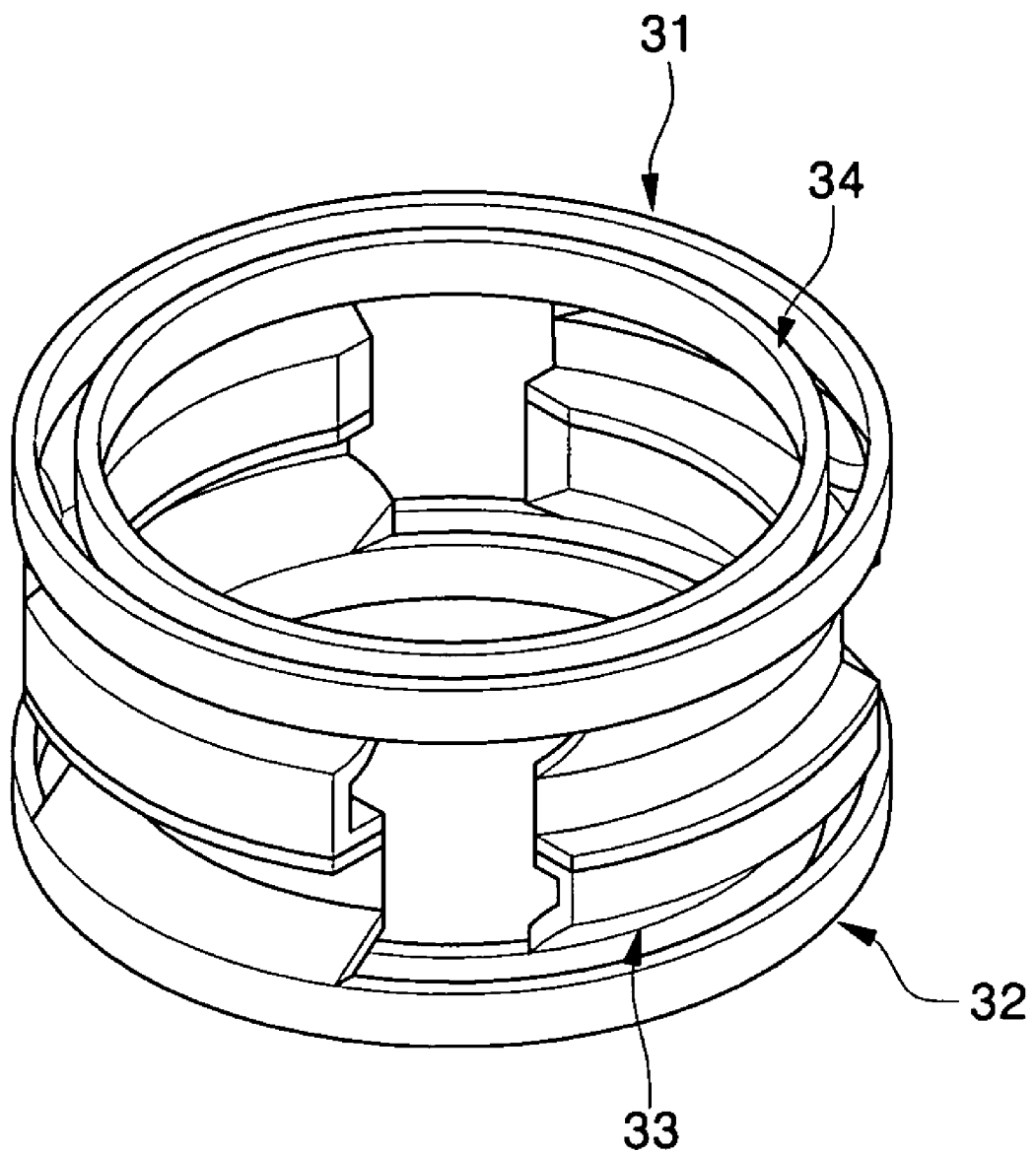
FIG. 7 is a perspective view of a connecting member in accordance with a first embodiment of the present invention.

FIG. 6 is a partial cross-sectional view of a first superconducting module in accordance with a first embodiment of the present invention, and FIG. 7 is a perspective view of a connecting member in accordance with a first embodiment of the present invention.

Figure 8:
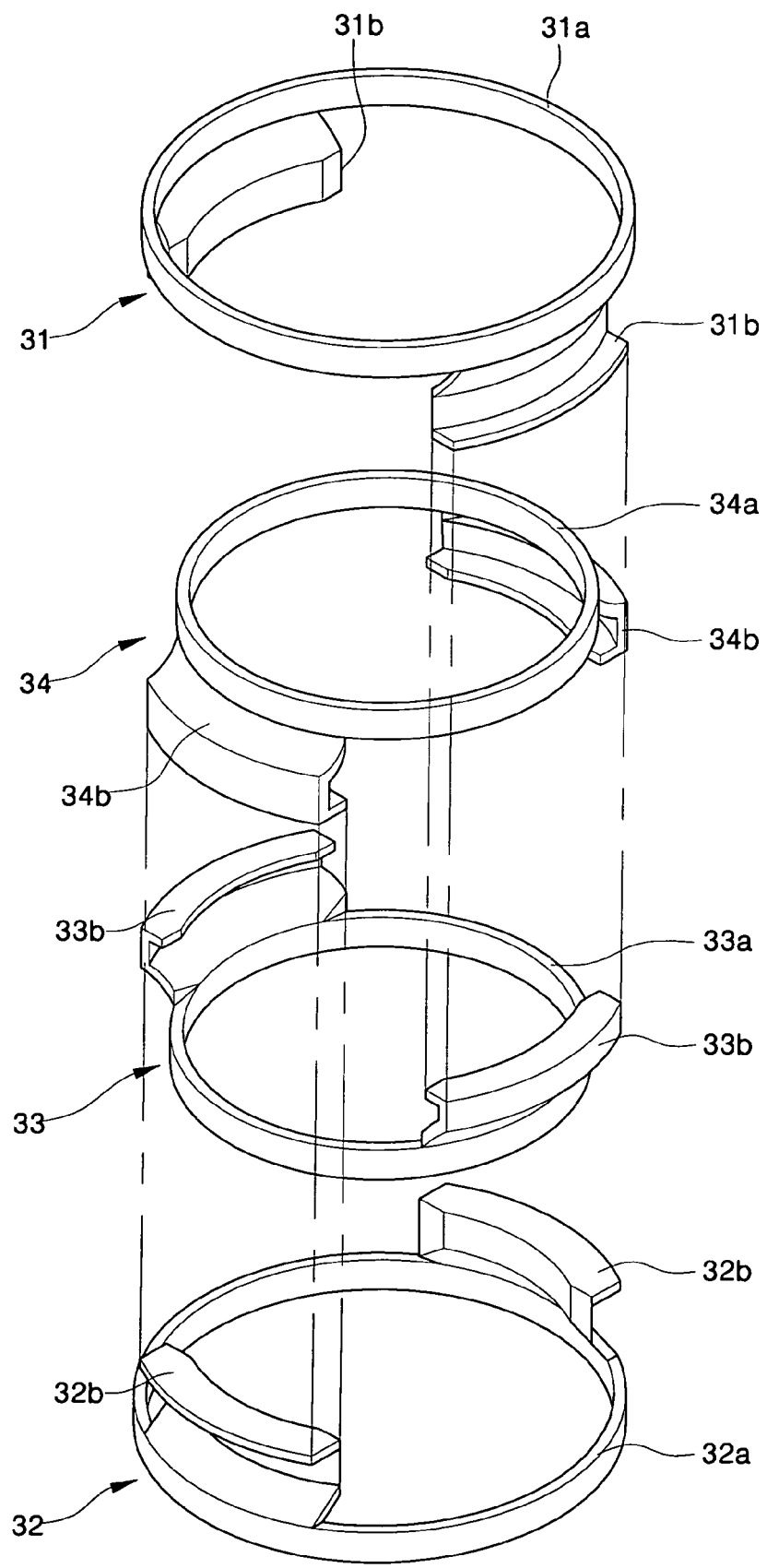
FIG. 8 is an exploded perspective view of a connecting member in accordance with a first embodiment of the present invention.
Figure 9:
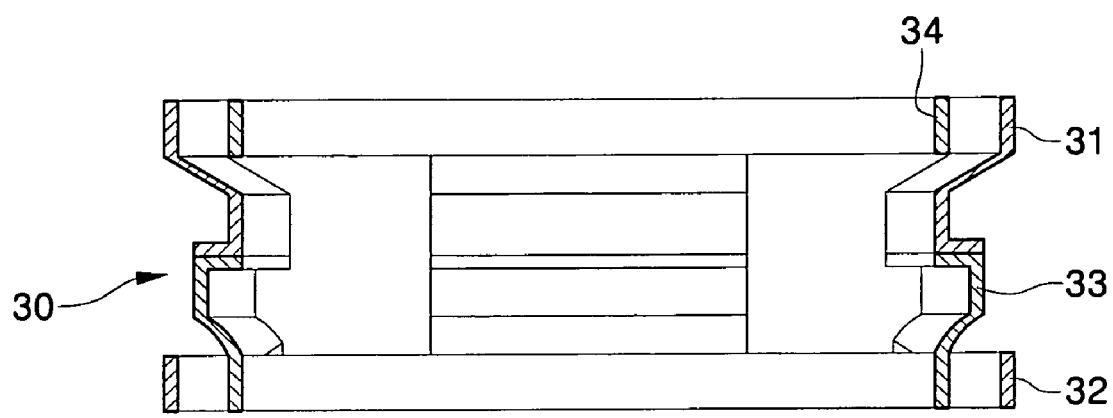
FIG. 9 is an assembled perspective view of a connecting member in accordance with a first embodiment of the present invention.
Figure 10:
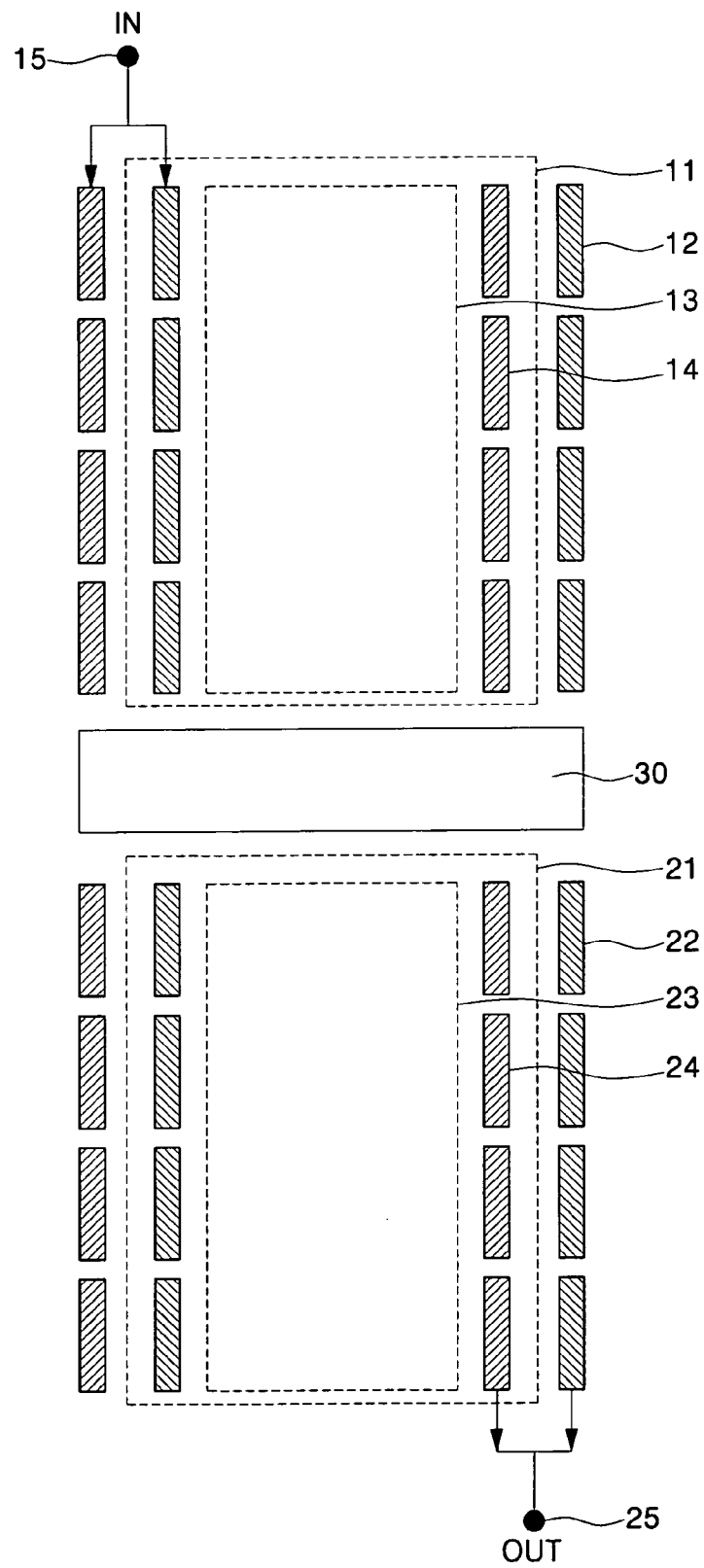
FIG. 10 is a schematic view illustrating connection of first and second superconducting modules in accordance with a first embodiment of the present invention.

FIG. 8 is an exploded perspective view of a connecting member in accordance with a first embodiment of the present invention, FIG. 9 is an assembled perspective view of a connecting member in accordance with a first embodiment of the present invention, and FIG. 10 is a schematic view illustrating connection of first and second superconducting modules in accordance with a first embodiment of the present invention.

Referring to FIGS. 3 to 10, the resistive superconducting fault current limiter in accordance with a first embodiment of the present invention includes a first superconducting module 10, a second superconducting module 20, and a connecting member 30.

Referring to FIGS. 3 to 5, the first superconducting module 10 is connected to an input terminal side of a power system (for example, a power transmission line) in order to stabilize insulation characteristics. The first superconducting module 10 includes a first outer bobbin 11, a first wire 12, a first inner bobbin 13, a second wire 14, a current introduction terminal 15.

Referring to FIG. 4, the first outer bobbin 11 has a predetermined diameter of cylindrical shape, and the first wire 12 is wound on a peripheral surface of the first outer bobbin 11 in one direction with a predetermined inclination angle.

The first inner bobbin 13 has a diameter smaller than that of the first outer bobbin 11, and is disposed in the first outer bobbin 11, as shown in FIG. 6.

At this time, the second wire 14 having a magnetic field opposite to the first wire 12 is wound around the first inner bobbin 13, and the winding of the second wire 14 is disposed on a peripheral surface of the first inner bobbin 13 in the other direction with a predetermined inclination angle.

Referring to FIG. 3, the current introduction terminal 15 is connected to an input terminal side of a power system, and connects the first and second wires 12 and 14 in parallel.

Referring to FIGS. 4 and 5, the second superconducting module 20 is symmetrically disposed to the first superconducting module 10 with reference to the connecting member 30, and connected to an output terminal side of a power system in order to stabilize insulation characteristics. The second superconducting module 20 includes a second outer bobbin 21, a third wire 22, a second inner bobbin 23, a fourth wire 24, and a current output terminal 25.

Referring to FIG. 4, the second outer bobbin 21 has a cylindrical shape with a diameter equal to the first outer bobbin 11, and the third wire 22 is wound on a peripheral surface of the second outer bobbin 21 in one direction with a predetermined inclination angle.

That is, the third wire 22 is wound around the second outer bobbin 21 in the same direction as the first wire 11.

Referring to FIG. 4, the second inner bobbin 23 has a cylindrical shape with a diameter smaller than that of the second outer bobbin 21, namely a diameter equal to the first inner bobbin 13. The second inner bobbin 23 is disposed in the second outer bobbin 21.

The fourth wire 24 is wound on a peripheral surface of the second inner bobbin 23 to be wound in the other direction with a predetermined inclination angle so that the fourth wire 4 has a magnetic field opposite to the third wire 22.

That is, the fourth wire 24 is wound around the second inner bobbin 23 in the same direction as the second wire 12.

Referring to FIG. 3, the current output terminal 25 is connected to an output terminal side of a power system, and connects the third and fourth wires 22 and 24 in parallel.

Referring to FIGS. 7, 8 and 9, the connecting member 30 is disposed between the first and second superconducting modules 10 and 20 to arrange the input and output terminals of the first and second superconducting modules 10 and 20 in directions opposite to each other as shown in FIG. 10. The connecting member 30 includes first to fourth connecting bodies 31, 32, 33 and 34.

The first connecting body 31 for electrically connecting the first and fourth wires 12 and 24 includes a first circular ring 31*a* fitted to the first outer bobbin 11, and a plurality of first connecting parts 31*b* extending downward from the first circular ring 31*a* to guide the first wire 12, which are integrally formed with each other.

The second connecting body 32 for electrically connecting the second and third wires 14 and 22 includes a second circular ring 32*a* fitted to the second outer bobbin 21, and a plurality of second connecting parts 32*b* extending upward from the second circular ring 32*a* to guide the third wire 22, which are integrally formed with each other.

The third connecting body 33 for electrically connecting the first and fourth wires 12 and 24 includes a third circular ring 33*a* that has a diameter smaller than that of the second circular ring 32*a* to be disposed in the second connecting body 32 and is fitted to the second inner bobbin 23, and a plurality of third connecting parts 33*b* that extend upward from the third circular ring 33*a* to guide the fourth wire 24 and are coupled to the first connecting parts 31*b*.

At this time, surface contact parts of the first and third connecting parts 31*b* and 33*b* are coupled to each other using welding or soldering.

The fourth connecting body 34 for electrically connecting the second and third wires 14 and 22 includes a fourth circular ring 34*a* that has a diameter smaller than that of the first circular ring 31*a* to be disposed in the first connecting body 31 and is fitted to the first inner bobbin 13, and a plurality of fourth connecting parts 34*b* that extend upward from the fourth circular ring 34*a* to guide the second wire 22 and are coupled to the second connecting parts 32*b*.

At this time, surface contact parts of the second and fourth connecting parts 32*b* and 34*b* may be coupled to each other using welding or soldering.

In addition, when the first and fourth wires 12 and 24 are guided along the first and third connecting bodies 31 and 33, ends of the first and fourth wires 12 and 24 are connected to each other, and when the second and third wires 14 and 22 are guided along the second and fourth connecting bodies 32 and 34, ends of the second and third wires are also connected to each other.

Hereinafter, operation of the first embodiment of the present invention will be described in conjunction with FIGS. 3 to 11.

First, a resistive superconducting fault current limiter in accordance with an embodiment of the present invention is connected to input and output terminal sides of a power system through a current introduction terminal 15 and a current output terminal 25, respectively.

Then, when a large current, i.e., a fault current generated due to the falling of a lightning, short-circuit, and so on, is applied through the input terminal side of the power system, the fault current is reduced by generating a resistance through the phase transition of the first and second superconducting modules 10 and 20 that are symmetrical about the connecting member 30 as shown in FIG. 10.

More specifically, the first superconducting module 10 has a multi-layered structure including a first outer bobbin 11 and a first inner bobbin 13, and the second superconducting module 20 also has a multi-layered structure including a second outer bobbin 21 and a second inner bobbin 23.

When the fault current is applied to the current introduction terminal 15, the fault current is guided to the first wire 12 of the first outer bobbin 11 and the second wire 14 of the first inner bobbin, which are connected to the current introduction terminal 15 in parallel and have winding directions opposite to each other.

At this time, the first wire 12 is connected to the fourth wire 24 of the second inner bobbin 23 included in the second superconducting module 20 through the first and third connecting bodies 31 and 33 of the connecting member 30, and the second wire 14 is connected to the third wire 22 of the second outer bobbin 21 included in the second superconducting module 20 having a winding direction opposite to the fourth wire 24 through the second and fourth connecting bodies 32 and 34 of the connecting member 30.

Therefore, the magnetic field represented from the first wire 12 of the first outer bobbin 11 has a direction opposite to the second wire 14 of the first inner bobbin 13.

In addition, the magnetic field represented from the third wire 22 of the second outer bobbin 21 has a direction opposite to the fourth wire 24 of the first second bobbin 23.

Since the module 10 and the module 20 are connected to each other by means of the connecting member 30, the fault current limiter has the bifilar characteristics.

That is, since the dielectric distance between the input terminal side and the output terminal side of the current limiter of the first embodiment in accordance with the present invention is set to reach a sufficient distance, and a distance between first and final turns to which operational voltage is applied is distant. Thereby, it is possible to obtain good electrical insulation characteristics.

In other words, from a viewpoint of cooling, since the first and second wires 12 and 14 and the third and fourth wires 22 and 24 of the first embodiment in accordance with the present invention are connected in parallel through the current introduction terminal 15 and the current output terminal 25, a width of increasing a temperature and a time needed to re-cool the temperature can be remarkably shorted.

That is, providing that the contact surface of the wires of the conventional deposited structure is neglected, a quantity of heat generated therefrom will be expressed as follows:

$$Q = (I^2 \rho 1)/A = J \rho p \, 1I \quad \text{[Formula 1]}$$

In this process, since a specific resistance ρ, a length l, a current density J of the parallel wires of the first embodiment in accordance with the present invention are equal to the wires of the conventional deposited structure, the quantity of heat Q is in proportion to the current 1, i.e., $Q \propto I$.

Therefore, while the current of the conventional multi-layered structure of n wires is entirely nI (Ampere, A), the current of each wire of the parallel structure of the present invention is I (A).

That is, since the heat quantity accumulated for the same time means that the wire deposited structure is larger than the wire parallel structure by the deposited number of times, the temperature increase of the conventional wire deposited structure is higher than that of the wire parallel structure of the first embodiment in accordance with the present invention.

In addition, a time that the increased temperature is lowered again to its original temperature is a time constant, which will be described as follows:

$$\tau = C\rho_d V/hS$$

Providing that a specific heat C, density τ d, and heat transfer efficient h are constant, the time constant τ is in proportion to a volume V and a surface area S.

Therefore, when the time constant τ of the conventional deposited wires and the parallel wires of the present invention is calculated using the above relationship, a time constant $\tau_{nt}$ of the conventional deposited wires is as the following formula 2:

$$\tau_{nt} = ntw/2(nt+w) \quad \text{[Formula 2]}$$

where n is the number of wires, t is a thickness of the wire, and w is a width of the wire.

In addition, a time constant $\tau_1$ the parallel wires of the first embodiment of the present invention is as the following formula 3:

$$\tau_t = tw/2(t+w) \quad \text{[Formula 3]}$$

At this time, calculation of a ratio of the time constants of Formulae 1 and 2 is as the following formula 4:

$$\tau_{nt}/\tau_t = n(t+w)/(nt+w) \quad \text{[Formula 4]}$$

In this process, due to characteristics of the superconducting wire, t<<w, and Formula 4 is expressed by the following formula 5:

$$\tau_{nt}/\tau_t \approx n \quad \text{[Formula 5]}$$

That is, the temperature decrease of the conventional deposited wires consumes a time longer than that of the parallel wires of the first embodiment of the present invention by about n times. This means that a re-operation time of the current limiter of the conventional deposited wire is longer than that of the parallel wires of the first embodiment of the present invention.

Figure 11:
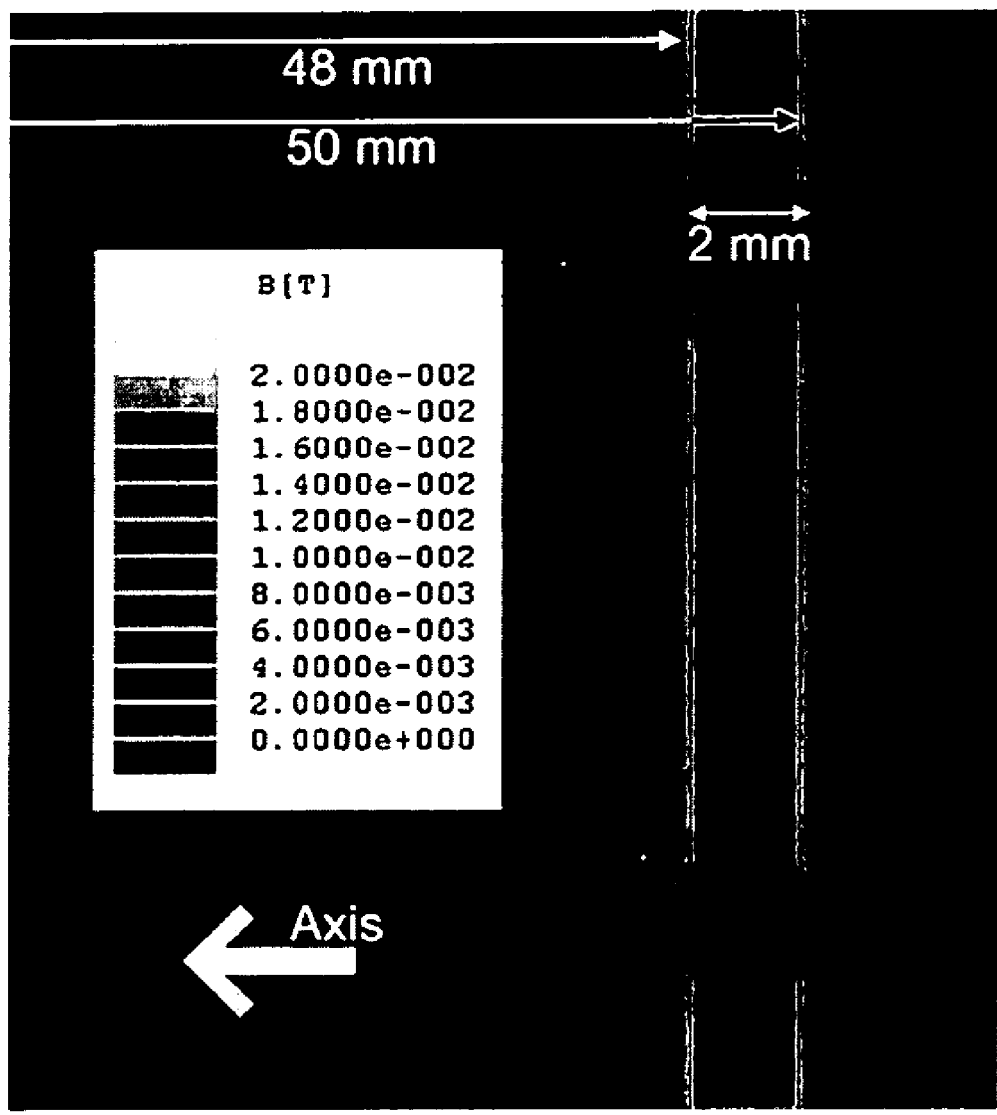
FIG. 11 is a simulation screen illustrating distribution of a magnetic field in a space of a superconducting module in accordance with a first embodiment of the present invention.

Meanwhile, FIG. 11 illustrates a simulation result that the first and second superconducting modules 10 and 20 of the current limiter are simulated in axial symmetry using an FEM tool, representing a magnetic field existing in a space.

Referring to FIG. 11, it will be appreciated that the magnetic field in the first and second superconducting modules 10 and 20 of the first embodiment of the present invention is about "0." This means that about 0.02 T of magnetic field (magnetic leakage flux) is generated between the outer coil and the inner coil.

In addition, it will be appreciated that a magnetic energy is 0.066J, and a inductance is about 12 μH by calculating the inductance using the magnetic energy equation.

Providing that the first embodiment of the present invention uses 16 current limiters, all of the current limiters have about 0.2 mH of inductance, which is corresponding to about 0.07 Ω of resistance.

Meanwhile, since the magnetic leakage flux generated between the outer coil and the inner coil is very small, most of the superconducting alternate current loss is a loss due to the transmission current. Calculating the magnetic leakage flux using the following formula 6, the Norris equation, the magnetic leakage flux $P_{sf}$ is about 0.06 W/m, and the magnetic leakage flux of all the current limiters is about 54.78 W.

$$P_{sf} = (f\mu_0 I_c^2/2\pi S_f) \times (2(1-i_m) \times LN(1-i_m) + 2i_m - i^2_m)[W/m] \quad \text{[Formula 6]}$$

Figure 12:
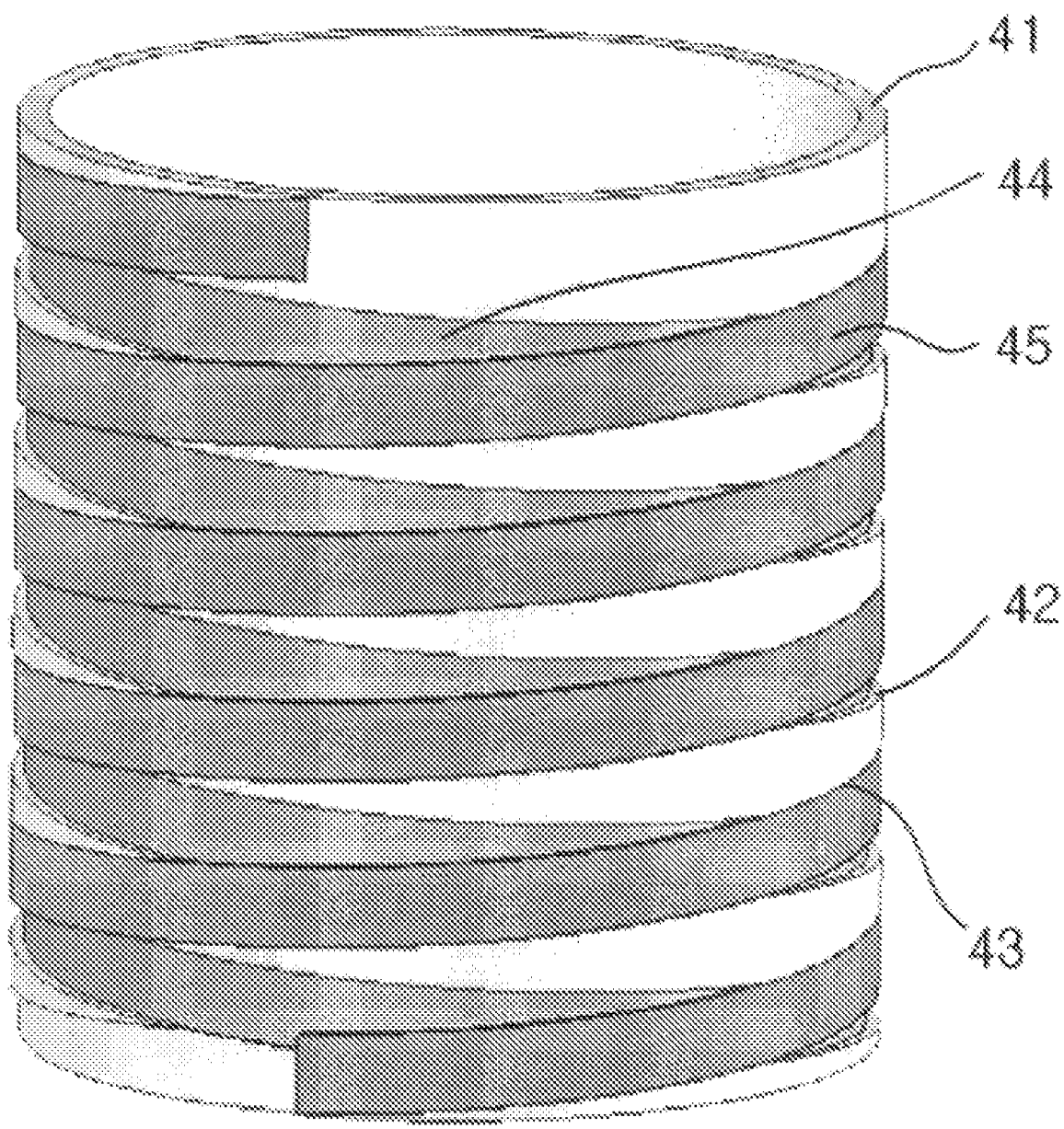
FIG. 12 illustrates a bobbin having a dual wire winding groove in accordance with a second embodiment of the present invention.
Figure 13:
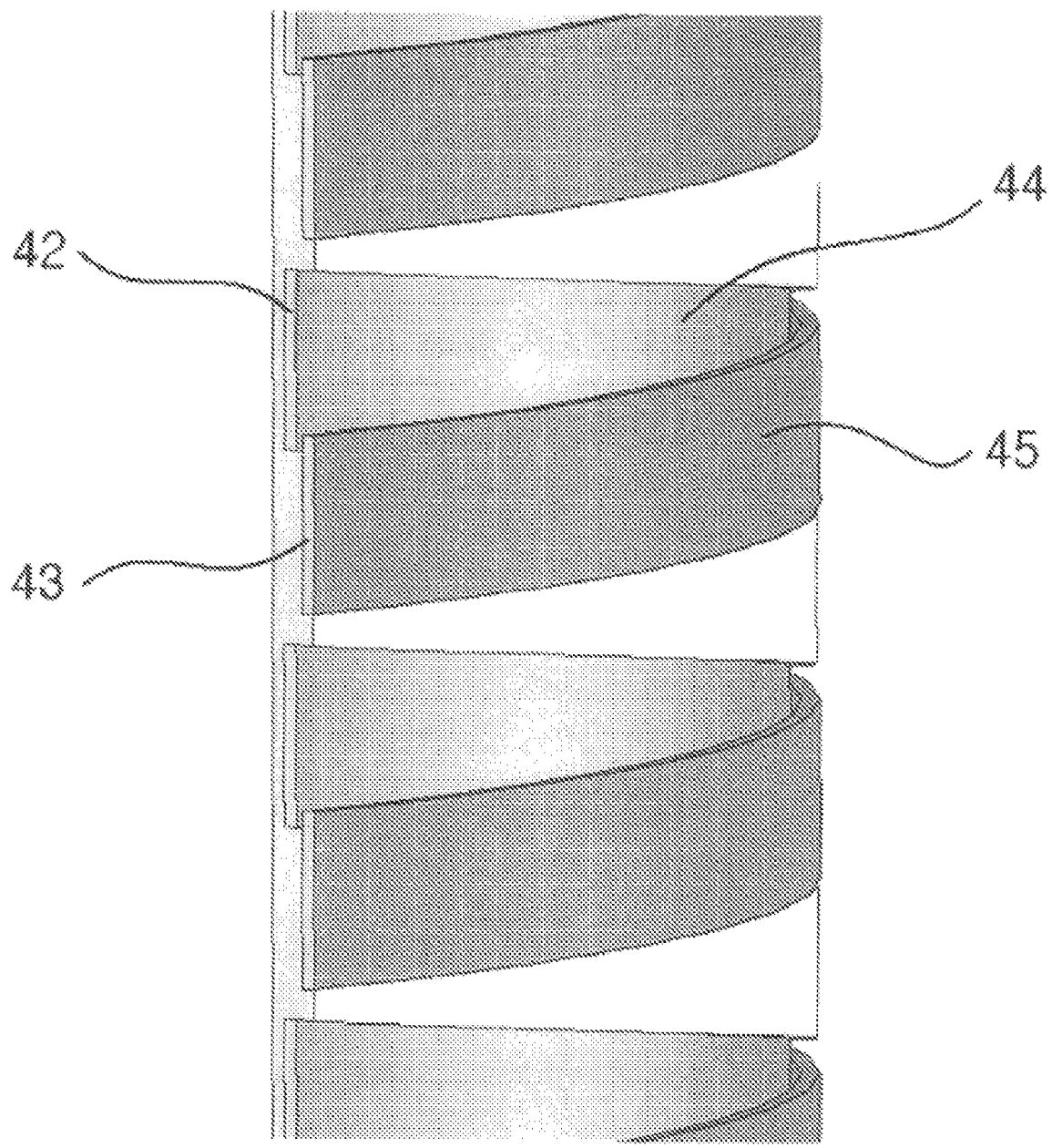
FIG. 13 is a schematic cross-sectional view of FIG. 12 illustrating a state that a plurality of wires are wound around one bobbin in accordance with a second embodiment of the present invention.

$I_c$: critical current density f: frequency $S_f$: space factor
$i_m$: ratio of critical current vs applied current
$\mu_0$: permeability in air representing magnetic susceptibility of air
LN: natural log FIGS. 12 and 13 illustrate a second embodiment of the present invention, showing a plurality of wires parallelly connected to one bobbin.

That is, the second embodiment of the present invention includes the plurality of wires wound around the one bobbin, rather than using the connecting member of the first embodiment.

The current limiter of the second embodiment includes a bobbin 41 having a predetermined diameter, a first wire winding groove 42 formed on a peripheral surface of the bobbin 41 in one direction with a predetermined inclination angle, a second wire winding groove 43 formed to have a depth different from the first wire winding groove 42 through a stepped surface in the other direction with a predetermined inclination angle, an inner wire 44 wound in the first wire winding groove 42, an outer wire 45 wound in the second wire winding groove 43, an insulating material (not shown) formed between the inner wire 44 and the outer wire 45, a current introduction terminal (not shown) and a current output terminal (not shown) connecting the inner and outer wires 44 and 45 in parallel.

In this process, the first and second wire winding grooves 42 and 43 formed in the bobbin 41 is shown to have a different width for the convenience of understanding, but have the same width in real.

That is, the first and second wire winding grooves 42 and 43 have the same width, and the inner and outer wires 44 and 45 of the same width are wound in the grooves 42 and 43, respectively.

As described above, while the first embodiment of the present invention has the structure that a plurality of wires are respectively wound around the plurality of bobbins in different directions, and then, the plurality of bobbins are symmetrically arranged through the connecting member in parallel, the second embodiment of the present invention has the structure that a plurality of wires are wound around one bobbin in different directions, and then, they are parallelly connected to each other, operation of which is the same as the first embodiment. Hereinafter, the description overlapping the first embodiment will be omitted.

In the second embodiment of the present invention, as a result of measuring inductance at a cryogenic temperature after manufacturing the resistive superconducting fault current limiter including a inner diameter 98 mm of bobbin having inner and outer layers on which 8.7 m of wires are respectively wound, it has been confirmed that the measured value of the inductance is less than 0.5 µH, and excellent non-induction characteristics can be obtained.

Figure 14:
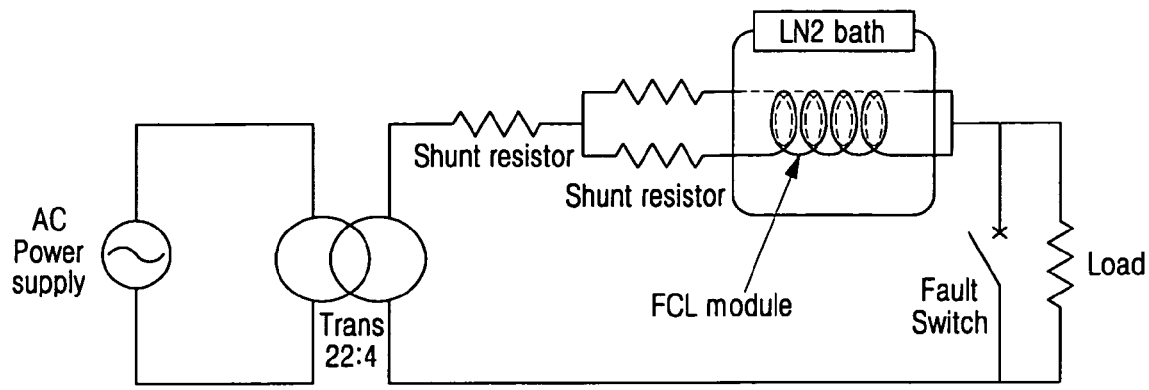
FIG. 14 is a circuit diagram for a current limiting test of a resistive superconducting fault current limiter in accordance with a second embodiment of the present invention.
Figure 15:
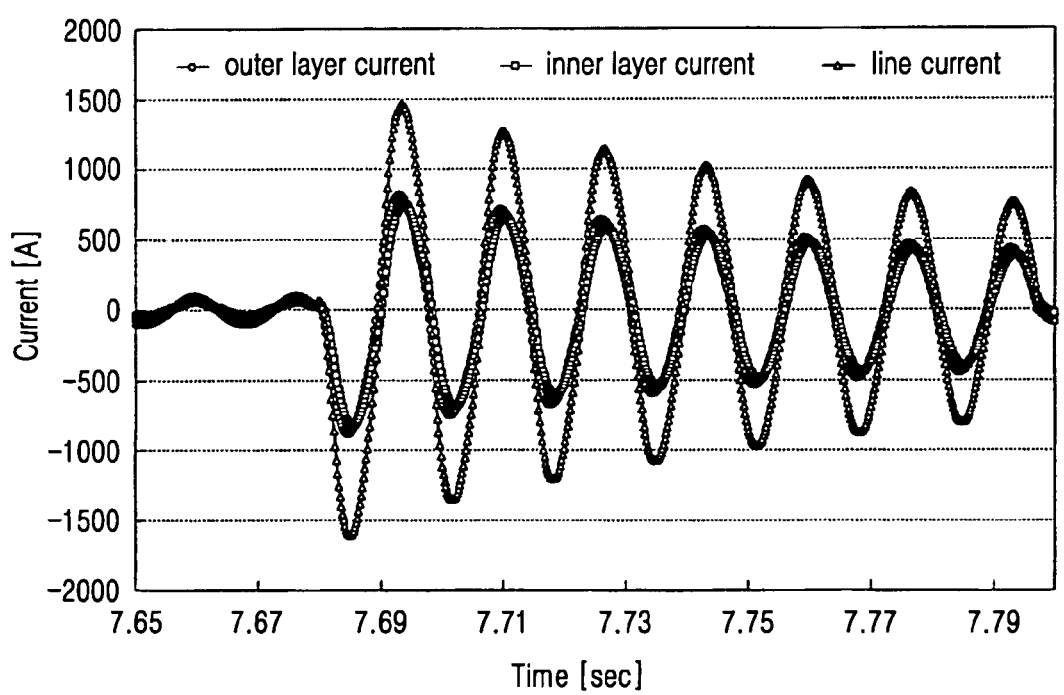
FIG. 15 is a current waveform of a test result of a circuit diagram of FIG. 14.

That is, as a result of performing a short circuit test of a current limiting module including constituting a circuit as shown in FIG. 14 for the short circuit test, applying current to an AC power supply up to 150V, operating a fault controller to generate a fault current for about 0.1 second, and performing a test for recovering the fault, it has been confirmed that the current is limited at about 1600 $A_{peak}$ when the resistive superconducting fault current limiter is used, while at least several kA may generate the fault current when the resistive superconducting fault current limiter is not used, as shown in FIG. 15.

Figure 16:
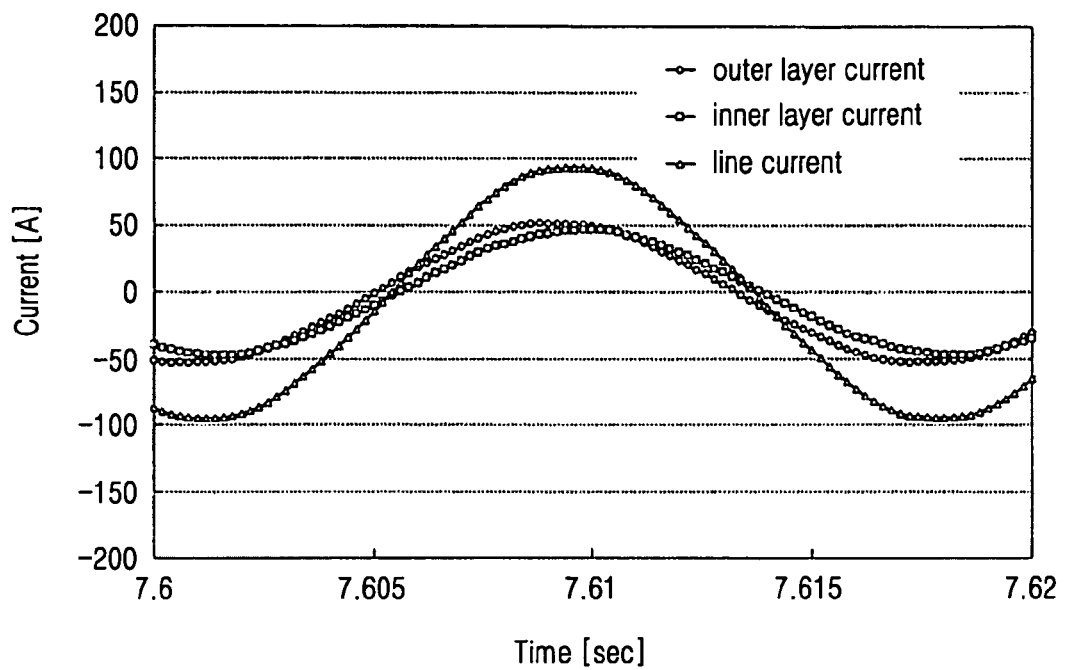
FIG. 16 is a current distribution waveform of a test result of a circuit diagram of FIG. 14.
Figure 17:
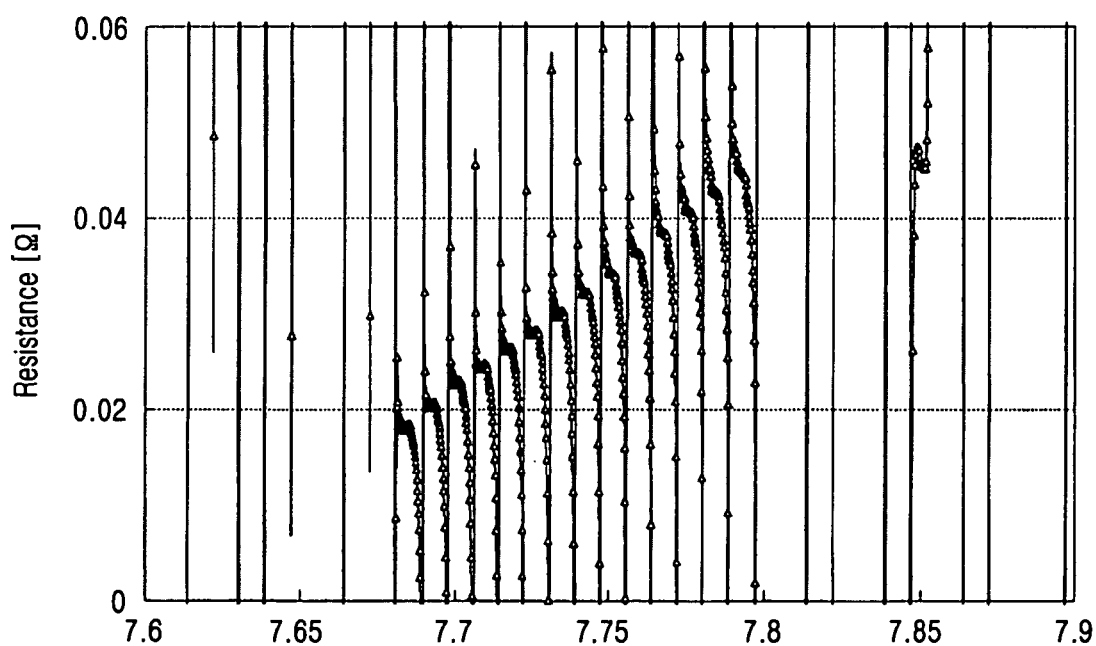
FIG. 17 is a resistance measurement waveform of a test result of a circuit diagram of FIG. 14.

In addition, as can be seen from the test result of FIG. 16, the current is uniformly distributed at about 1:1 of a current distribution ratio between the inner and outer layers, and as shown in FIG. 7, as a result of measurement of resistance generated due to the fault current, the resistance is instantly generated to about 0.02 Ω to limit the fault current, and then, the resistance is rapidly increased up to about 0.045 Ω. Entirely reviewing the test results, it will be appreciated that the resistive superconducting fault current limiter in accordance with the present invention has excellent resistive characteristics.

In accordance with the present invention, after the inner bobbin is disposed in the outer bobbin, the wires are wound around the inner and outer bobbins to be connected through the current introduction terminal in directions opposite to each other to thereby constitute the superconducting module, and the module is symmetrically formed through the connecting member, thereby completing the current limiter. Therefore, it is possible to obtain the following effects.

First, it is possible to obtain a higher insulation resistance by locating an input terminal and an output terminal of the current limiter opposite to each other to stabilize insulation characteristics, though using the same length as a conventional superconducting wire.

Second, it is possible to reduce a temperature increasing width, and rapidly recovering a re-cooling speed of the current limiter.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A resistive superconducting fault current limiter comprising:
    a first superconducting module connected to an input terminal of a power system to stabilize insulation characteristics, the first superconducting module comprising two superconducting coils;
    a second superconducting module connected to an output terminal of the power system to stabilize insulation characteristics, the second superconducting module comprising two superconducting coils; and
    a connecting member interposed between the first and second superconducting modules such that the input terminal of the power system connected to the first superconducting module is disposed in a geometrically opposite relationship to the output terminal of the power system connected to the second superconducting module.

2. The resistive superconducting fault current limiter according to claim 1, wherein the first superconducting module further comprises:
    a first outer bobbin having a predetermined diameter;
    a first wire wound on a peripheral surface of the first outer bobbin in one direction with a predetermined inclination angle;
    a first inner bobbin having a diameter smaller than that of the first outer bobbin and disposed in the first outer bobbin;
    a second wire wound on a peripheral surface of the first inner bobbin in the other direction with a predetermined inclination angle so that the second wire has a magnetic field opposite to the first wire; and
    a current introduction terminal for connecting the first and second wires in parallel.

3. The resistive superconducting fault current limiter according to claim 2, wherein the second superconducting module further comprises:
    a second outer bobbin having a predetermined diameter;
    a third wire wound on a peripheral surface of the second outer bobbin in one direction with a predetermined inclination angle;
    a second inner bobbin having a diameter smaller than that of the second outer bobbin and disposed in the second outer bobbin;
    a fourth wire wound on a peripheral surface of the second inner bobbin in the other direction with a predetermined inclination angle so that the fourth wire has a magnetic field opposite to the third wire; and
    a current output terminal for connecting the third and fourth wires in parallel.

4. The resistive superconducting fault current limiter according to claim 3, wherein the connecting member further comprises;
- a first connecting body coupled to the first outer bobbin for electrical connection of the first and fourth wires;
- a second connecting body coupled to the second outer bobbin for electrical connection of the second and third wires;
- a third connecting body disposed in the second connecting body for electrical connection of the first and fourth wires and coupled to the first connecting body and the second inner bobbin; and
- a fourth connecting body disposed in the first connecting body for electrical connection of the second and third wires and coupled to the second connecting body and the first inner bobbin.

5. The resistive superconducting fault current limiter according to claim 4, wherein the first connecting body further comprises a first circular ring fitted to the first outer bobbin and a first connecting part extending from the first circular ring to guide the first wire.

6. The resistive superconducting fault current limiter according to claim 4, wherein the second connecting body further comprises a second circular ring fitted to the second outer bobbin, and a second connecting part extending from the second circular ring to guide the third wire.

7. The resistive superconducting fault current limiter according to claim 5, wherein the third connecting body further comprises a third circular ring fitted to the second inner bobbin; and a third connecting part extending from the third circular ring to guide the fourth wire and fitted to the first connecting part.

8. The resistive superconducting fault current limiter according to claim 6, wherein the fourth connecting body farther comprises a fourth circular ring fitted to the first inner bobbin, and a fourth connecting part extending from the fourth circular ring to guide the second wire and fitted to the second connecting part.

9. A resistive superconducting fault current limiter having a superconducting module disposed between an input terminal side and an output terminal side of a power system for stabilization of insulation characteristics, characterized in that the superconducting module comprises one bobbin having a predetermined diameter, and a plurality of wires wound around the bobbin in a multi-layered manner, the wires having a same critical current characteristic.

10. The resistive superconducting fault current limiter according to claim 9, wherein the bobbin comprises:
- a first wire winding groove formed on a peripheral surface of the bobbin with a predetermined inclination angle, the first wire winding groove running in one direction; and
- a second wire winding groove formed to have a depth different from the first wire winding groove through a stepped surface with a predetermined inclination angle, the second wire winding groove running in the other direction opposite the first wire winding groove.

11. The resistive superconducting fault current limiter according to claim 10, wherein the first and second wire winding grooves have the same width.

12. The resistive superconducting fault current limiter according to claim 10, wherein an inner wire is wound in the first wire winding groove, and an outer wire is wound in the second wire winding groove.

13. The resistive superconducting fault current limiter according to claim 12, wherein the inner and outer wires are wound on a peripheral surface of the bobbin in directions opposite to each other.

14. The resistive superconducting fault current limiter according to claim 12, wherein an insulating material is formed between the inner wire and the outer wire.

15. The resistive superconducting fault current limiter according to claim 12, wherein the inner and outer wires are connected in parallel to a current introduction terminal and a current output terminal, and the current introduction terminal and the current output terminal are respectively connected to the input terminal side and the output terminal side of the power system.

* * * * *